United States Patent
Fujii

(10) Patent No.: US 9,123,834 B2
(45) Date of Patent: Sep. 1, 2015

(54) SOLID-STATE IMAGE SENSING DEVICE MANUFACTURING METHOD AND SOLID-STATE IMAGE SENSING DEVICE

(71) Applicant: KABUSHIKI KAISHA TOSHIBA, Tokyo (JP)

(72) Inventor: Osamu Fujii, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 204 days.

(21) Appl. No.: 13/838,110

(22) Filed: Mar. 15, 2013

(65) Prior Publication Data

US 2014/0077271 A1 Mar. 20, 2014

(30) Foreign Application Priority Data

Sep. 14, 2012 (JP) .................................. 2012-202960

(51) Int. Cl.
*H01L 27/146* (2006.01)
*H01L 31/02* (2006.01)
*H01L 31/18* (2006.01)

(52) U.S. Cl.
CPC ............ *H01L 31/02* (2013.01); *H01L 27/1461* (2013.01); *H01L 27/1464* (2013.01); *H01L 27/14609* (2013.01); *H01L 27/14612* (2013.01); *H01L 27/14641* (2013.01); *H01L 27/14643* (2013.01); *H01L 27/14689* (2013.01); *H01L 31/18* (2013.01)

(58) Field of Classification Search
CPC ................... H01L 27/14609; H01L 27/14612; H01L 27/14643

USPC ....................................................... 438/59, 66
See application file for complete search history.

(56) References Cited

U.S. PATENT DOCUMENTS

| 2006/0183268 | A1* | 8/2006 | Rhodes ........................... 438/98 |
| 2008/0042170 | A1* | 2/2008 | Han .............................. 257/229 |
| 2008/0169491 | A1 | 7/2008 | Maruyama |
| 2008/0217724 | A1* | 9/2008 | Uya .............................. 257/460 |
| 2009/0315132 | A1* | 12/2009 | Kohyama ...................... 257/432 |
| 2010/0214457 | A1 | 8/2010 | Sakai |

FOREIGN PATENT DOCUMENTS

| JP | 2004-172394 | 6/2004 |
| JP | 2006-147680 | 6/2006 |
| JP | 2008-103664 | 5/2008 |
| JP | 2008-103667 | 5/2008 |
| JP | 2008-103668 | 5/2008 |
| JP | 2008-172005 | 7/2008 |
| JP | 2010-3928 | 1/2010 |

(Continued)

*Primary Examiner* — Marvin Payen
*Assistant Examiner* — Jeremy Joy
(74) *Attorney, Agent, or Firm* — Oblon, McClelland, Maier & Neustadt, L.L.P.

(57) ABSTRACT

According to one embodiment, a solid-state image sensing device manufacturing method includes forming a photoelectric converting element, a diffusion layer included in a floating diffusion, and a read transistor, in a photoelectric converting element formation region of a semiconductor substrate, a floating diffusion formation region, and a read transistor formation region located between the photoelectric converting element formation region and the floating diffusion formation region, respectively, and forming a semiconductor layer including a impurity on the diffusion layer on the semiconductor substrate.

11 Claims, 9 Drawing Sheets

(56) References Cited

FOREIGN PATENT DOCUMENTS

| JP | 2010-192794 | 9/2010 |
| JP | 2011-155248 | 8/2011 |
| JP | 2011155248 A * | 8/2011 |

* cited by examiner

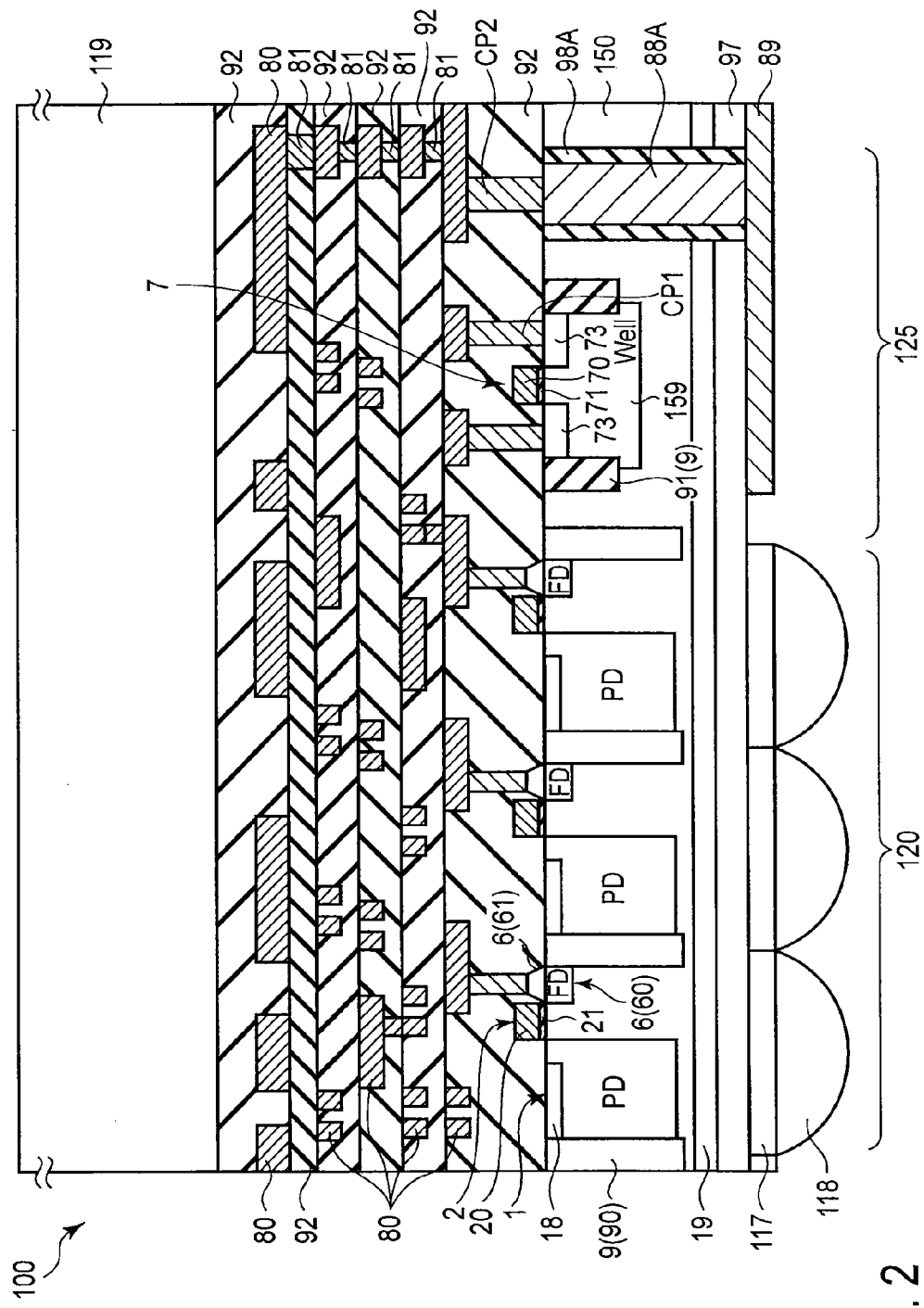
F I G. 2

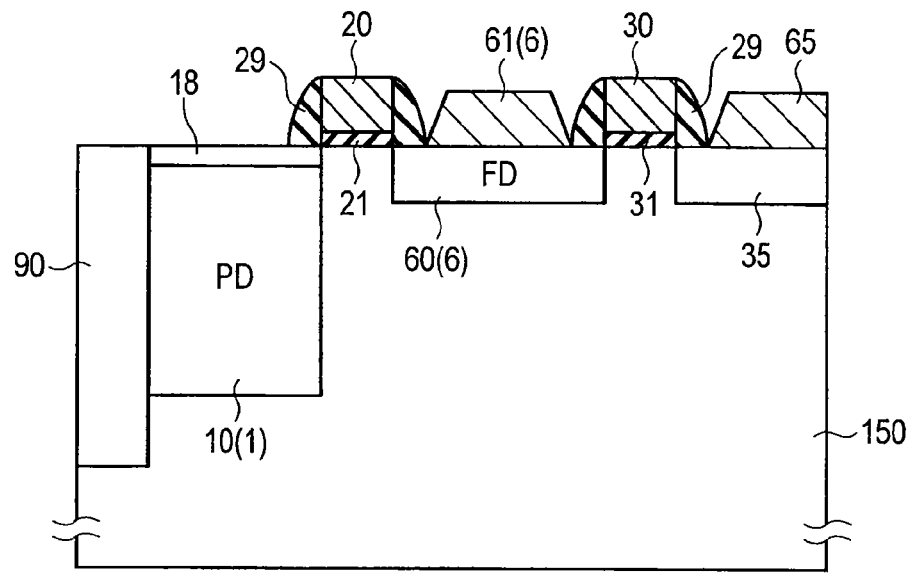
F I G. 7
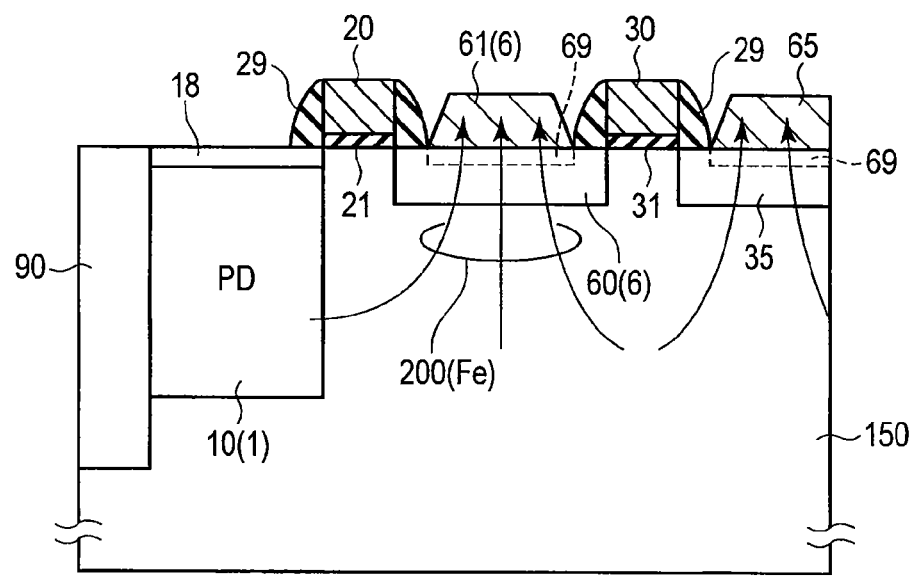
F I G. 8

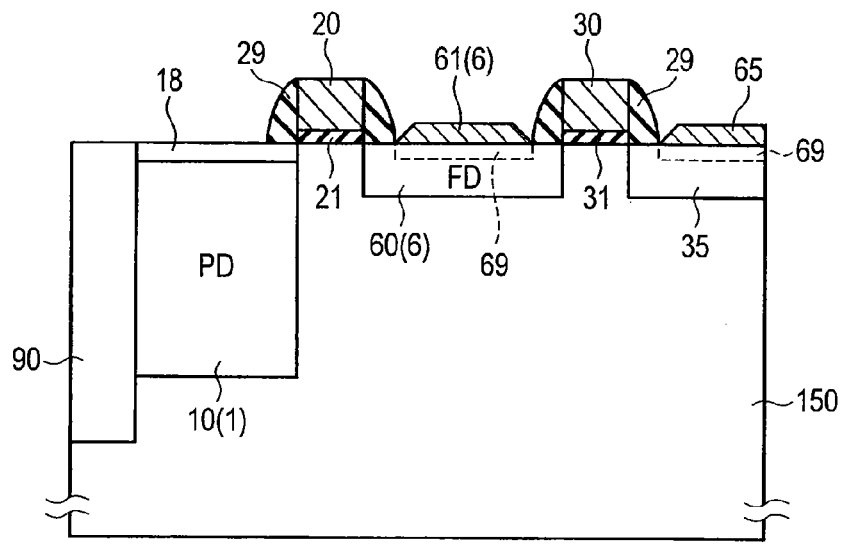
F I G. 9
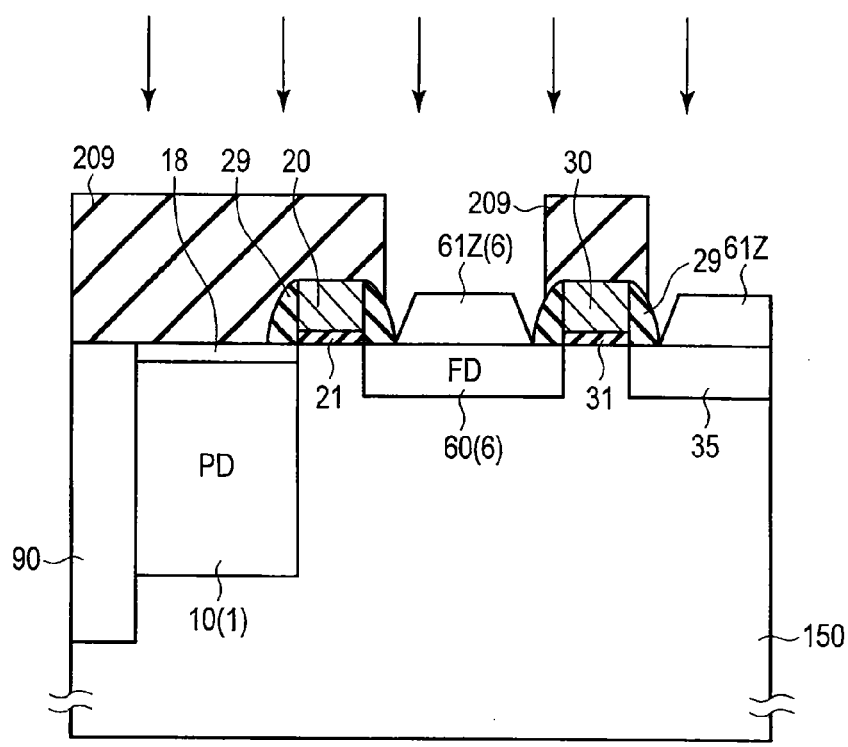
F I G. 10

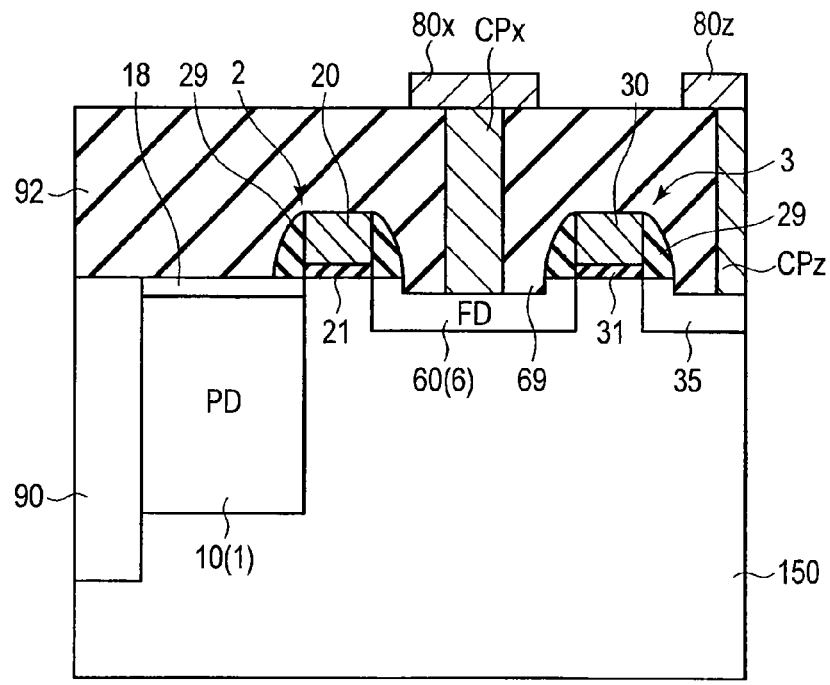
F I G. 11
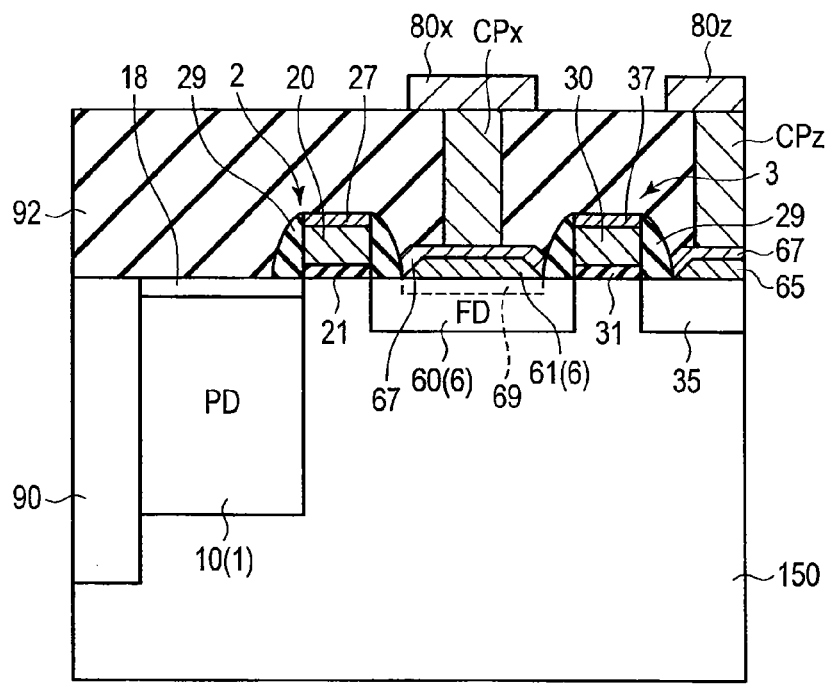
F I G. 12

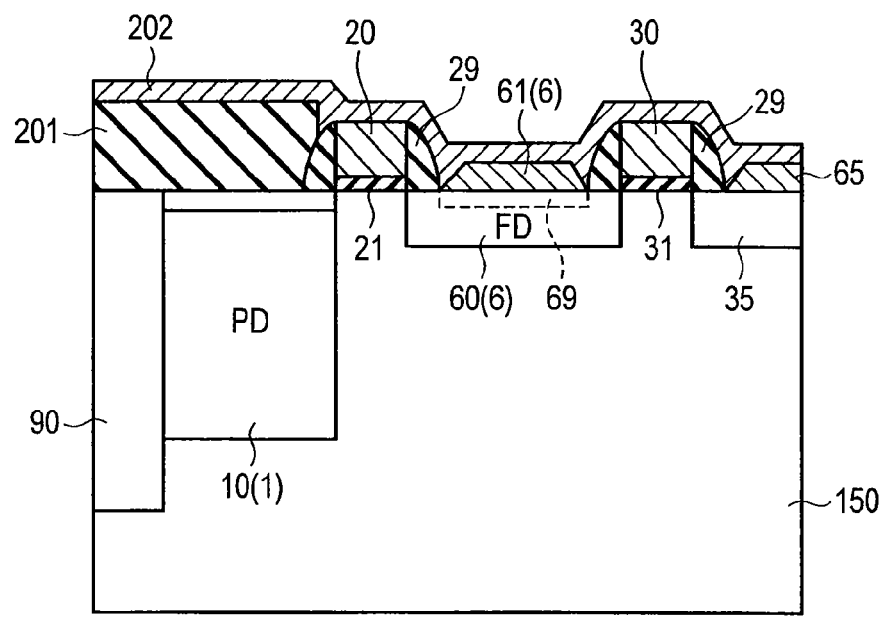
F I G. 13
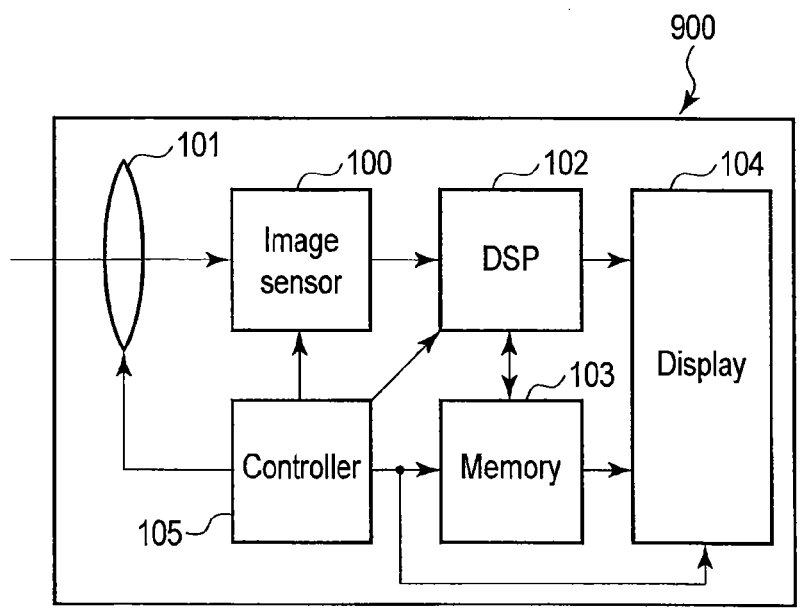
F I G. 14

SOLID-STATE IMAGE SENSING DEVICE MANUFACTURING METHOD AND SOLID-STATE IMAGE SENSING DEVICE

CROSS-REFERENCE TO RELATED APPLICATIONS

This application is based upon and claims the benefit of priority from Japanese Patent Application No. 2012-202960, filed Sep. 14, 2012, the entire contents of which are incorporated herein by reference.

FIELD

Embodiments described herein relate generally to a solid-state image sensing device manufacturing method and a solid-state image sensing device.

BACKGROUND

Solid-state image sensing devices such as CCD image sensors and CMOS image sensors are used for various purposes in, for example, digital still cameras, video cameras, or surveillance cameras. Single-plate image sensors that acquire information for a plurality of colors by a single pixel array are mainly used.

In recent years, back side illumination type image sensors that bring in light from a subject from the back side of a semiconductor substrate have been under development.

BRIEF DESCRIPTION OF THE DRAWINGS

FIG. 2 is a diagram showing an example of the sectional structure of the solid-state image sensing device according to the embodiment;

FIG. 7 is a sectional process view showing a process in a method of manufacturing the solid-state image sensing device according to the embodiment;

FIG. 8 is a sectional process view showing a process in a method of manufacturing the solid-state image sensing device according to the embodiment;

FIG. 9 is a sectional process view showing a process in a method of manufacturing the solid-state image sensing device according to the embodiment;

FIG. 10 is a view showing modifications of the solid-state image sensing device according to the embodiment;

FIG. 11 is a view showing modifications of the solid-state image sensing device according to the embodiment;

FIG. 12 is a view showing modifications of the solid-state image sensing device according to the embodiment;

FIG. 13 is a view showing modifications of the solid-state image sensing device according to the embodiment; and FIG. 14 is a view showing an application of the solid-state image sensing device according to the embodiment.

DETAILED DESCRIPTION

Embodiments

Hereinafter, an embodiment will be described in detail with reference to the drawings. Elements having the same functions and configurations are provided with the same reference signs in the following explanation, and are repeatedly explained when necessary.

In general, according to one embodiment, a solid-state image sensing device manufacturing method includes forming a photoelectric converting element, a diffusion layer included in a floating diffusion, and a read transistor, in a photoelectric converting element formation region of a semiconductor substrate, a floating diffusion formation region, and a read transistor formation region located between the photoelectric converting element formation region and the floating diffusion formation region, respectively; and forming a first semiconductor layer including a first impurity on the diffusion layer on a first surface of the semiconductor substrate.

(1) First Embodiment

A solid-state image sensing device and a solid-state image sensing device manufacturing method according to the first embodiment are described with reference to FIG. 1 to FIG. 9.

(a) Structure

The structure of the solid-state image sensing device according to the first embodiment is described with reference to FIG. 1 to FIG. 5.

Figure 1:
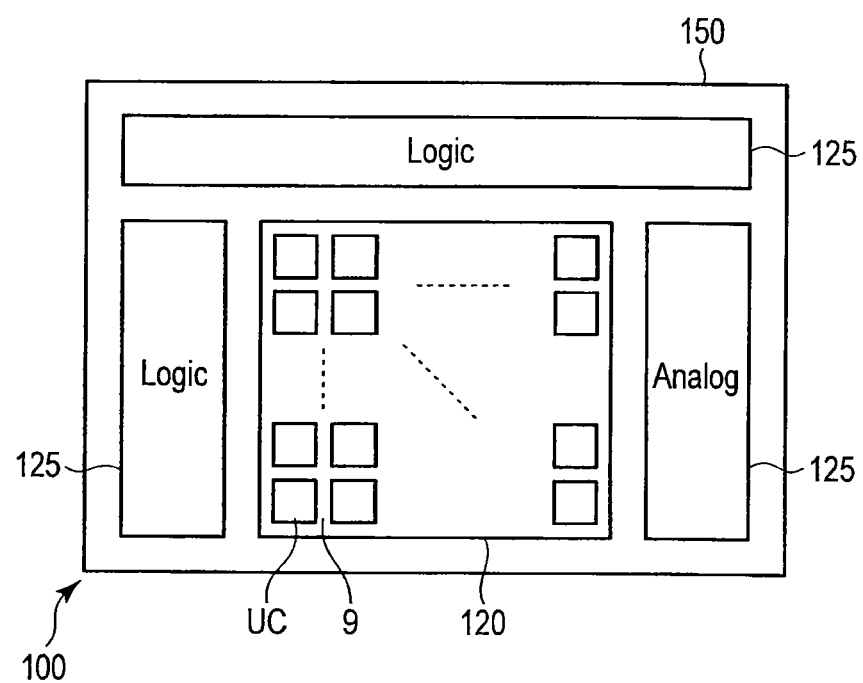
FIG. 1 is a diagram showing an example of the chip layout of a solid-state image sensing device according to an embodiment.

FIG. 1 is a schematic diagram showing a layout example of a chip of the solid-state image sensing device (hereinafter referred to as an image sensor) according to the present embodiment. FIG. 2 is a schematic sectional view showing the structure of the image sensor according to the present embodiment.

As shown in FIG. 1 and FIG. 2, in an image sensor 100 according to the present embodiment, a pixel array 120 and a peripheral circuit region 125 in which an analog circuit or logic circuit for controlling the pixel array 120 are formed is provided in one semiconductor substrate (chip) 150.

An Si single crystal substrate (bulk substrate) or an epitaxial layer of an SOI substrate is used as the semiconductor substrate 150.

The pixel array 120 includes a plurality of unit cells UC. The unit cells (unit cell regions) UC are arranged in matrix form in the pixel array 120.

Each unit cell UC includes a photoelectric converting element for converting light from a subject (external light) to an electric signal. One unit cell UC includes at least one photoelectric converting element. A pixel is formed by using the photoelectric converting element. A region in which a pixel is formed inside the unit cell is called a pixel region. Each pixel region includes one photoelectric converting element.

The unit cells UC adjacent to each other, the pixel regions adjacent to each other, and photoelectric converting element adjacent to each other are separated by a device isolation region 9. A formation region of each unit cell UC or each photoelectric converting element is surrounded by the device isolation region 9.

For example, a photodiode is used to form a photoelectric converting element 1. As shown in FIG. 2, the photodiode 1 is formed by at least one impurity layer in the semiconductor substrate 150. The photodiode 1 photoelectrically converts the light from the subject to an electric signal (charge, voltage) corresponding to the amount of light. The photodiode 1 can store the generated charge in the impurity layer.

The unit cell UC includes a floating diffusion as a signal detector.

A diffusion layer (impurity semiconductor layer) 60 as a floating diffusion 6 is provided in the semiconductor substrate 150. The diffusion layer 60 as the floating diffusion 6 temporarily holds a charge output from the photodiode 1 via a later-described field effect transistor 2.

A semiconductor layer 61 is provided on the diffusion layer 60. The semiconductor layer 61 is used as the floating diffusion 6 together with the diffusion layer 60. Hereinafter, the semiconductor layer 61 which forms the floating diffusion 6 and which is provided on the semiconductor substrate 150 will also be referred to as an elevated floating diffusion.

A read transistor 2 is provided on the semiconductor substrate 150 between the photodiode 1 and the floating diffusion 6. A gate electrode 20 of the read transistor 2 is provided on a channel region within the semiconductor substrate 150 across a gate insulating film 21.

The unit cells UC (pixels) are used to form the image sensor 100. The unit cell UC may include other components in addition to the at least one photodiode 1, the floating diffusion 6, and the read transistor 2, in accordance with the circuit configuration of the image sensor 100. For example, the unit cell UC includes an amplifier transistor and a reset transistor as the components.

As shown in FIG. 1 and FIG. 2, the peripheral circuit region 125 is provided in the semiconductor substrate 150 to be adjacent to the pixel array 120 across a device isolation region 9.

Circuits such as a later-described vertical shift register and an AD conversion circuit are provided in the peripheral circuit region 125.

The peripheral circuit region 125 is electrically isolated from the pixel array 120 by the device isolation region 9. For example, a device isolation insulating film 91 having an STI structure is embedded in the device isolation region 9 for dividing the peripheral circuit region 125.

A plurality of devices such as a field effect transistor 7, a resistive element, and a capacitive element are used to form the circuits in the peripheral circuit region 125. In FIG. 2, the field effect transistor 7 is only shown for simplicity. Although one field effect transistor is only shown in FIG. 2, a plurality of devices to form peripheral circuits are provided on the semiconductor substrate 150.

For example, in the peripheral circuit region 125, the field effect transistor 7 is provided in a well region 159 within the semiconductor substrate 150. Two diffusion layers (impurity layers) 73 are provided in the well region 159. The two diffusion layers 73 function as the source/drain of the transistor 7. A gate electrode 70 is provided on the surface of the well region (channel region) between the two diffusion layers 73 via a gate insulating film 71. Thus, the field effect transistor 7 is formed in the well region 159.

A plurality of interlayer insulating films 92 are stacked on the semiconductor substrate 150 to cover the gate electrodes 20 and 70 of the transistors 2 and 7 and the upper surfaces of the photodiode 1. For example, silicon oxide is used for the interlayer insulating films 92.

A multilayer interconnection technique is used for the image sensor 100 according to the present embodiment. That is, a plurality of interconnects 80 are provided in the stacked interlayer insulating films 92 in accordance with each interconnect level (height based on the surface of the substrate).

By plugs 81, CP1, and CP2 that are respectively embedded in the interlayer insulating films 92, the interconnects 80 are electrically connected to other interconnects located at different interconnect levels. A dummy layer and a light blocking film made of the same material as the interconnects 80 may be provided in the interlayer insulating films 92.

The gate electrodes 20 and 70 of the transistors 2 and 7, the source/drain diffusion layers 73, and terminals of the devices formed on the semiconductor substrate 150 are connected to the interconnects 80 in the interlayer insulating films 92 via the contact plugs CP1 and CP2. The lower interconnect 80 and the upper interconnect 80 connect the devices provided on the semiconductor substrate 150 via the via plug 81 embedded in the interlayer insulating films 92. Consequently, the circuits in the image sensor 100 are formed by the multilayer interconnection technique.

In the present embodiment, a surface in which devices are formed, more specifically, the surface of the semiconductor substrate 150 in which the gate electrodes 20 and 70 of the transistors 2 and 7 are provided is referred to as a front surface (first surface) of the semiconductor substrate 150. The interlayer insulating films 92 and the interconnects 80 that are formed by the multilayer interconnection technique are provided on the front surface of the semiconductor substrate 150. Hereinafter, the surface of the semiconductor substrate 150 opposite to the front surface (the surface opposite to the front surface) in a direction perpendicular to the front surface of the semiconductor substrate 150 is referred to as a back surface (second surface, rear surface). In the present embodiment, the front surface and back surface of the semiconductor substrate 150 are referred to as the main surface of the semiconductor substrate 150 when not distinguished from each other.

A via (hereinafter referred to as a through via or a through electrode) 88A is formed in the semiconductor substrate 150, for example, by a through substrate via (TSV) technique to pass through the semiconductor substrate 150 from the front side of the semiconductor substrate 150 to the back side (rear side). An insulating layer 98A is provided on the inner surface of the through-hole (opening) formed in the semiconductor substrate 150.

The through via 88A is connected to the interconnect 80 in the interlayer insulating films 92 via the contact plug CP2. The through via 88A is connected to a pad (electrode) 89 provided on the back side of the semiconductor substrate 150. The pad 89 is provided on an insulating layer (planarizing layer or protective layer) 97 on the back surface of the semiconductor substrate 150.

For example, in the present embodiment, a color filter 117 is provided on the back side of the semiconductor substrate 150 via a protective layer (not shown) and an adhesive layer (not shown), as shown in FIG. 2.

The color filter 117 is provided at a position corresponding to the pixel array 120 on the back side of the semiconductor substrate 150. For example, the image sensor 100 according to the present embodiment is a single-plate image sensor. The color filter 117 used in the single-plate image sensor has a plurality of dye films corresponding to a plurality of colors (color information) included in the light from the subject.

The color filter 117 includes the dye films corresponding to red, blue, and green based on, for example, a bayer arrangement. One dye film is provided to correspond to one photodiode (pixel) 1. The color filter 117 may include white and yellow dye films in addition to the red, blue, and green.

A microlens array 118 is provided on the color filter 117 on the back side of the semiconductor substrate 150. The microlens array 118 includes a plurality of microlenses corresponding to the respective photodiodes 1.

In the image sensor 100 according to the present embodiment, the color filter 117 and the microlens array 118 are provided on the surface (back surface) of the semiconductor substrate 150 opposite to the surface (front surface) in which the gate electrodes 20 and 70 of the transistors 2 and 7 and the interlayer insulating films 92 are provided.

The light from the subject is applied to the pixel array 120 from the back side of the semiconductor substrate 150 via the color filter 117, and brought into the photodiode 1.

A support substrate 119 is provided on the interlayer insulating film 92. The support substrate 119 is stacked on the interlayer insulating film 92, for example, via a protective layer (not shown) and an adhesive layer (not shown). For example, a silicon substrate or an insulating substrate is used for the support substrate 119. The semiconductor substrate 150 having the devices formed therein intervenes between the support substrate 119 and the color filter 117.

In the present embodiment, the surface to receive the light from the subject is the back surface of the semiconductor substrate 150 to which the color filter 117 and the microlens array 118 are attached.

An image sensor, such as the image sensor 100 according to the present embodiment, having a structure in which light from the back side of the semiconductor substrate 150 is applied to the photodiode 1 is referred to as a back side illumination type image sensor.

An example of the circuit configuration of the pixel array 120 included in the image sensor 100 according to the present embodiment is described with reference to FIG. 3.

Figure 3:
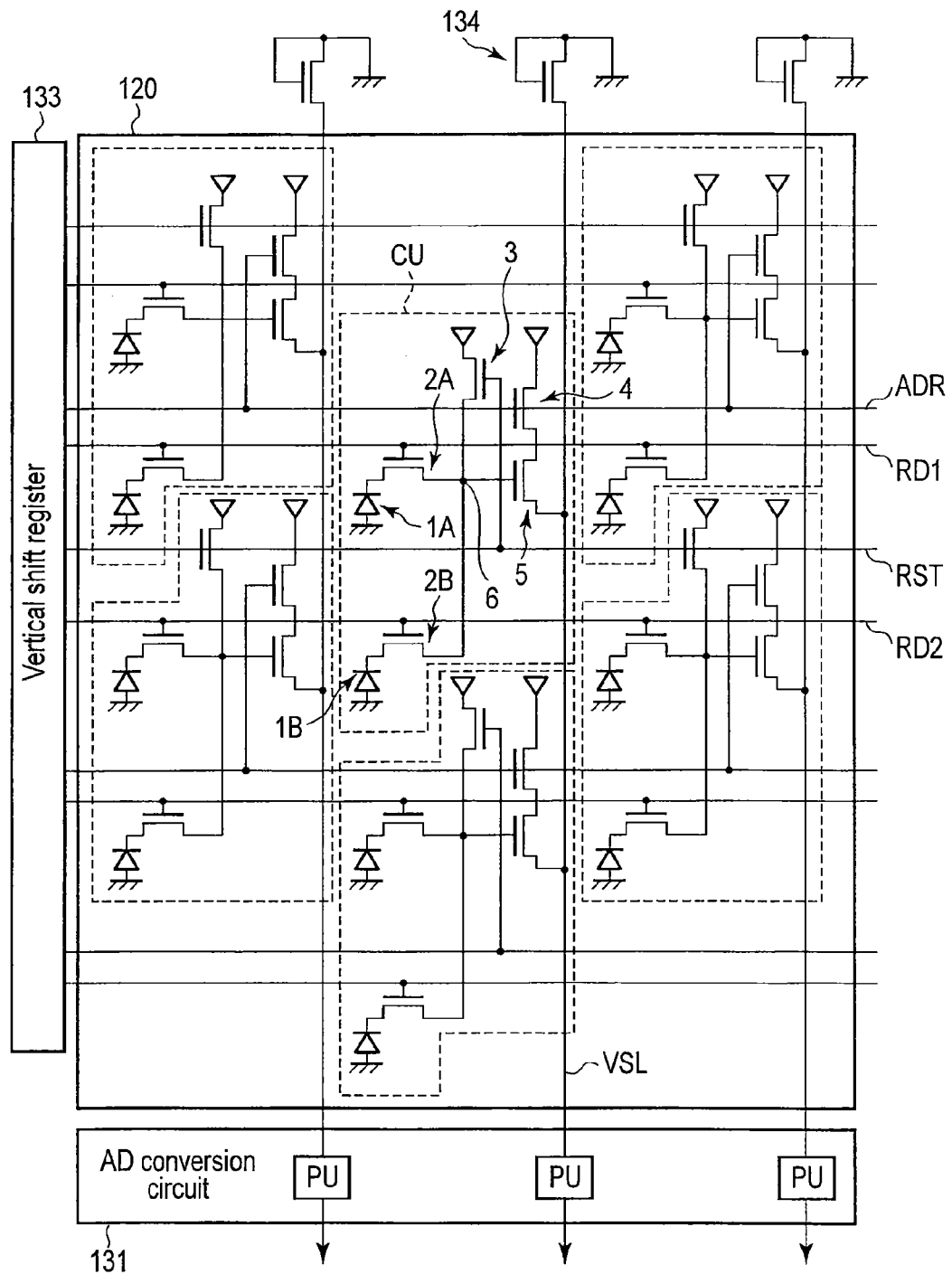
FIG. 3 is an equivalent circuit diagram of a pixel array and circuits located in its vicinity in the solid-state image sensing device according to the embodiment.

FIG. 3 is a diagram showing a circuit configuration example of the pixel array 120 and circuits in its vicinity.

As shown in FIG. 3, the unit cells UC are arranged in the pixel array 120. Each unit cell UC is provided at the intersection of read control lines RD1 and RD2 and a vertical signal line VSL.

The unit cell shown in FIG. 3 has a two-pixel one-cell structure in which one unit cell UC includes two pixels. In the unit cell UC having the two-pixel one-cell structure, one floating diffusion 6 is shared by two photodiodes 1A and 1B.

The unit cell UC includes, for example, five transistors 2A, 2B, 3, 4, and 5. Each of the transistors 2A, 2B, 3, 4, and 5 is, for example, an re-channel MOS transistor. The transistors included in the unit cell UC are, for example, read transistors 2A and 2B, an amplifier transistor 5, an address transistor 4, and a reset transistor 3. In the unit cell UC having the two-pixel one-cell structure, the two read transistors 2A and 2B are provided to correspond to the photodiodes 1A and 1B, respectively.

The anodes of the photodiodes 1A and 1B are connected to a fixed voltage line, and are, for example, grounded (connected to a ground terminal). The cathodes of the photodiodes 1A and 1B are connected to the floating diffusion 6 via the current paths of the read transistors 2A and 2B, respectively. As described above, the photodiodes 1A and 1B convert the light which has passed through the microlens and the color filter to an electric signal (signal charge), and store the charge. Hereinafter, the photodiodes 1A and 1B are referred to as the photodiode 1 when not distinguished from each other.

Each of the read transistors 2A and 2B controls the storage and transfer of the signal charge of each of the photodiodes 1A and 1B. The gates of read transistor 2A and 2B are connected to the read control line RD1 and RD2, respectively. One ends of the current paths of the read transistors 2A and 2B are connected to the cathode of the photodiode 1A and 1B, respectively. The other ends of the current paths of the read transistors 2A and 2B are connected to the floating diffusion 6, respectively. Hereinafter, the read transistors 2A and 2B are referred to as the read transistor 2B when not distinguished from each other.

In the unit cell UC having the two-pixel one-cell structure, the reset transistor 3, the address transistor 4, and the amplifier transistor 5 are shared by the two photodiodes 1A and 1B.

The reset transistor 3 resets the potential of the floating diffusion 6 (the gate potential of the amplifier transistor 5). The gate of the reset transistor 3 is connected to a reset control line RST. One end of the current path of the reset transistor 3 is connected to the floating diffusion 6 and the other end of the current path of the reset transistor 3 is connected to a power supply terminal (for example, ground terminal).

The address transistor 4 functions as a selecting element to select (activate) the unit cell UC. The gate of the address transistor 4 is connected to an address control line ADR. One end of the current path of the address transistor 4 is connected to the other end of the current path of the amplifier transistor 5 and the other end of the current path of the address transistor 4 is connected to the power supply terminal (for example, ground terminal).

The amplifier transistor 5 amplifies a signal from the photodiode 1 held by the floating diffusion 6. The gate of the amplifier transistor 5 is connected to the floating diffusion 6. One end of the current path of the amplifier transistor 5 is connected to the vertical signal line VSL and the other end of the current path of the amplifier transistor 5 is connected to one end of the current path of the address transistor 4. The signal amplified by the amplifier transistor 5 is output to the vertical signal line VSL as a signal of the unit cell (or pixel). The amplifier transistor 5 functions as a source follower in the unit cell UC.

A vertical shift register 133 is connected to the two read control lines RD1 and RD2, an address control line ADR, and a reset control line RST. The vertical shift register 133 controls the potentials (signal levels) of the read control line RD1 and RD2, the address control line ADR, and the reset control line RST to control and select a plurality of unit cells UC (and pixels) inside the pixel array 120 in rows. The vertical shift register 133 outputs a control signal (voltage pulse) to turn transistors 2A, 2B 3 and 4 on and off to control lines RD1, RD2, ADR and RST, respectively.

An AD conversion circuit 131 is connected to the vertical signal line VSL. The AD conversion circuit 131 includes a processing unit PU to convert an analog signal from the unit cell into a digital signal or to perform correlated double sampling (CDS) processing of a signal from the unit cell UC.

A load transistor 134 is used as a current source for the vertical signal line VSL. One end of the current path of the load transistor 134 is connected to one end of the current path of the amplifier transistor 5 via the vertical signal line VSL. The other end of the current path of the load transistor 134 is connected to a power supply terminal (for example, a grand terminal). The gate of the load transistor 134 is connected to the other end of the current path of the load transistor 134.

Each of the unit cells UC may include no address transistor 4. In this case, in the unit cell UC, the other end of the current path of the amplifier transistor 5 is connected to the other end of the current path of the reset transistor 3 and a power supply terminal. When the unit cell UC includes no address transistor 4, the address control line ADR is not provided either.

The unit cell UC may have a one-pixel one-cell structure including one pixel. Alternatively, the unit cell UC may have a circuit configuration (multiple-pixel one-cell structure) in which one unit cell includes three or more pixels (photodiodes) as in a four-pixel one-cell structure or an eight-pixel one-cell structure. In a unit cell including a plurality of pixels, three or more photodiodes share one floating diffusion, the reset transistor, the amplifier transistor, and the address transistor. In a unit cell including a plurality of pixels, one read transistor is provided for each photodiode.

The structures of the pixel array and the unit cell of the image sensor 100 according to the present embodiment are described with reference to FIG. 4 and FIG. 5.

Figure 4:
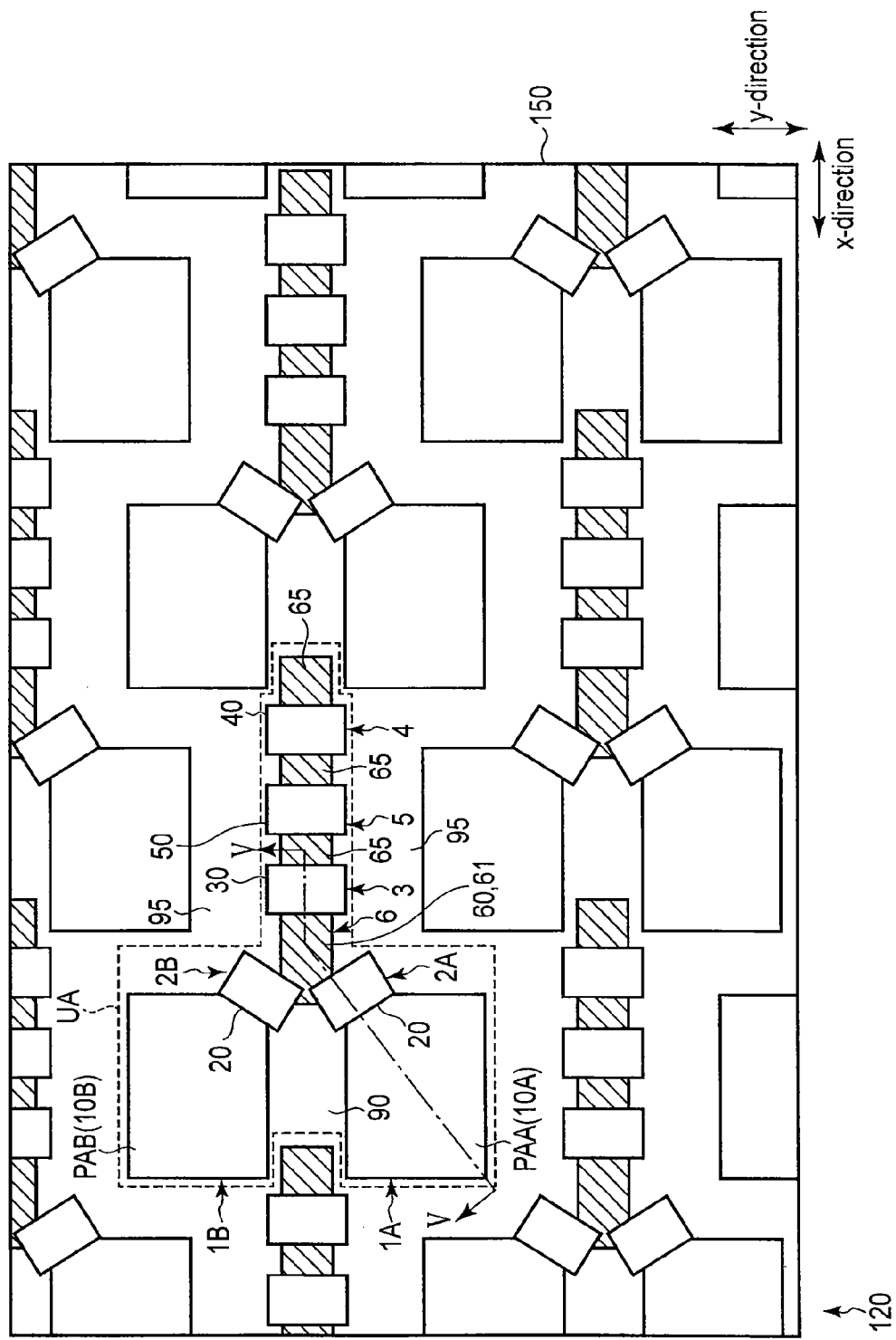
FIG. 4 is a plan view showing an example of the layout in the pixel array of the solid-state image sensing device according to the embodiment.

FIG. 4 shows an example of the planar layout of the pixel array of the image sensor 100 according to the present embodiment.

In FIG. 4, the layout of the unit cell UC having the two-pixel one-cell structure in the pixel array 120 is shown.

As shown in FIG. 4, a region where the two photodiodes 1A and 1B are formed, and a region where the transistors 2, 3, 4, and 5 for controlling the operations of photodiodes and the floating diffusion 6 are formed are provided in a formation region UA of the unit cell UC.

The region UA where the unit cell UC is formed is referred to as the unit cell formation region UA. Regions PAA and PAB where the photodiodes are formed are referred to as photodiode formation regions PAA and PAB. The photodiode formation regions PAA and PAB are referred to as the photodiode formation region PA when not distinguished from each other.

A region where the read transistor is formed is referred to as a read transistor formation region. A region where the floating diffusion 6 is formed is referred to as a floating diffusion formation region.

A region AA where the amplifier transistor 5, the reset transistor 3, and the address transistor 4 are formed is referred to as a transistor formation region (or active region) AA.

The unit cell formation region UA is divided by device isolation regions 90 and 95 for each unit cell UC in the pixel array 120. The unit cell formation region UA is surrounded by the device isolation regions 90 and 95.

The photodiode formation region PA, the read transistor formation region, the floating diffusion formation region, and the transistor region AA are semiconductor regions provided in the semiconductor substrate (chip) 150, in the unit cell formation region UA. In one unit cell formation region UA, at least the photodiode formation region, the read transistor formation region, and the floating diffusion formation region are continuous semiconductor regions in the semiconductor substrate 150.

In one unit cell formation region UA, adjacent corners of the two photodiode formation regions PAA and PAB are connected to one end of the longitudinal direction (extending direction) of the rectangular transistor formation region AA via the read transistor formation region and the floating diffusion formation region.

The two photodiode formation regions PAA and PAB in one unit cell formation region UA are adjacent to each other in a y-direction across the device isolation region (device isolation layer) 90. For example, the two photodiode formation regions PAA and PAB in one unit cell formation region UA are separated by an impurity semiconductor layer as the device isolation layer 90.

However, the two pixel formation regions PAA and PAB in the unit cell formation region UA may be separated by the device isolation layer 90 made of an insulator. That is, the pixel formation regions PA of different unit cell formation regions UA are electrically isolated by the insulator as the device isolation layer.

The photodiode formation region PA includes impurity semiconductor layers (diffusion layer, impurity semiconductor regions) 10A and 10B for forming the photodiode 1. For example, each of the impurity semiconductor layers 10A and 10B in the photodiode formation region PA is used as one end (source/drain region) of the current path of the read transistor 2.

In the read transistor formation region, the gate electrode 20 of the read transistor 2 is tilted relative to the extending direction of the transistor formation region AA. In the two-pixel one-cell structure, the read transistors 2A and 2B respectively corresponding to the two photodiodes 1A and 1B are switched on/off to electrically connect or disconnect the photodiodes 1A and 1B and the floating diffusion 6 provided in the continuous semiconductor regions.

The floating diffusion 6 is laid out in the unit cell formation region UA to be surrounded by the gate electrodes 20 of the two read transistors 2A and 2B and a gate electrode 30 of the reset transistor 3. The floating diffusion 6 is used as the other end (source/drain region) of the current path of the read transistor 2.

The transistor formation region is separated by an insulator as the device isolation layer 95. In the transistor formation region, the reset transistor 3, the amplifier transistor 5, and the address transistor 4 are arranged in the extending direction of the transistor formation region AA.

The gate electrode 30 of the reset transistor 3 is provided on the transistor formation region AA via a gate insulating film. The channel length direction of the reset transistor 3 corresponds to the extending direction (longitudinal direction) of the transistor formation region AA.

The floating diffusion 6 substantially serves as one end (source/drain region) of the current path of the reset transistor 3. The other end of the current path of the reset transistor 3 is a diffusion layer (impurity semiconductor layer) provided in the transistor formation region.

In the longitudinal direction of the transistor formation region AA, the address transistor 4 is located at the end opposite to the side (one end) where the floating diffusion 6 is provided.

A gate electrode 40 of the address transistor 4 is provided on the transistor formation region AA via a gate insulating film. The source/drain region as the other end of the current path of the address transistor 4 is provided at the end (opposite to the side where the floating diffusion 6 is provided) of the extending direction of the active region AA. The source/drain region as the other end of the current path of the address transistor 4 is not shared with other transistors. For example, a contact plug (not shown) is provided on the source/drain region of the address transistor 4 which is not shared with other transistors.

In the transistor formation region AA, the amplifier transistor 5 is laid out between the reset transistor 3 and the address transistor 4.

Between the gate electrode 30 of the reset transistor 3 and the gate electrode 40 of the address transistor 4, a gate electrode 50 of the amplifier transistor 5 is provided on the transistor formation region AA via a gate insulating film.

A source/drain region as one end of the current path of the amplifier transistor 5 is shared with the source/drain region as the other end of the current path of the reset transistor 3. The source/drain region as the other end of the current path of the amplifier transistor 5 is shared with the source/drain region as one end of the current path of the address transistor 4.

The gate electrode 50 of the amplifier transistor 5 is connected to the floating diffusion 6 via an interconnect and a plug.

In this way, the adjacent transistors 3, 4, and 5 share the source/drain regions (one end and the other of the current path). This allows the reduction of the area occupied by the unit cell formation region UA and the miniaturization of the unit cell UC.

Figure 5:
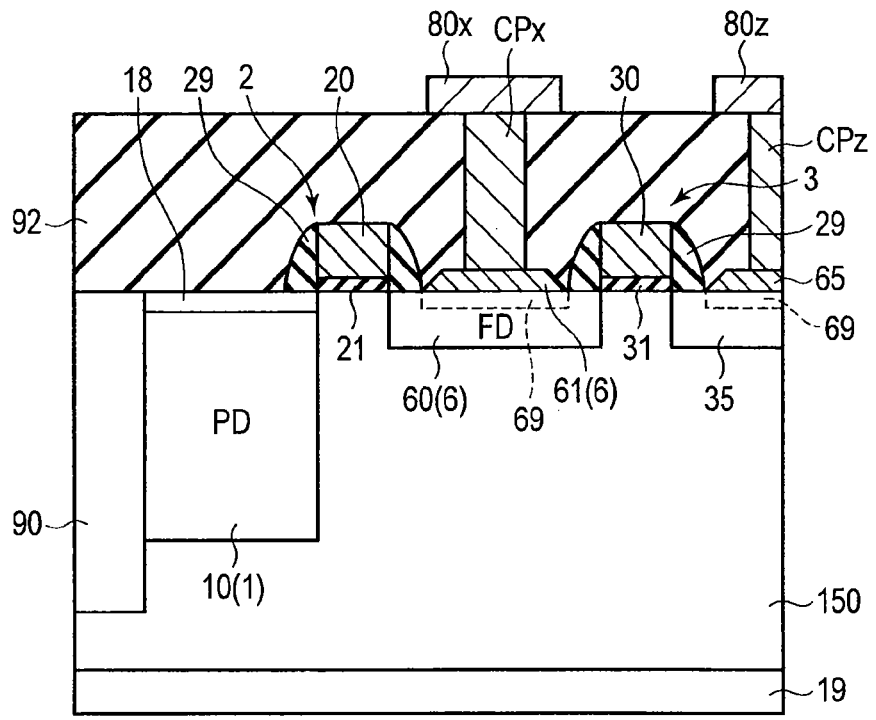
FIG. 5 is a sectional view showing the structure of a cell included in the solid-state image sensing device according to the embodiment.

FIG. 5 shows a sectional structure along the line V-V of FIG. 4. In FIG. 5, the photodiode 1, the read transistor 2, the floating diffusion 6, and the reset transistor 3 are shown as the components of the unit cell UC. The interconnects and the support substrate on the front side of the semiconductor substrate 150, and the color filter and the microlens array on the back side of the semiconductor substrate 150 are not shown in FIG. 5.

As shown in FIG. 5, the photodiode 1, the read transistor 2, the floating diffusion 6, and the reset transistor 3 are provided in the continuous semiconductor regions.

When the photodiode 1 is formed in the P-type semiconductor substrate (semiconductor layer) 150, the photodiode 1 includes at least one N-type impurity semiconductor layer 10.

In FIG. 5, for the simplification of the drawing, one N-type impurity semiconductor layer 10 is only shown as the component of the photodiode 1. However, in order to improve the characteristics (e.g., sensitivity and photoelectric conversion efficiency) of the photodiode 1, a plurality of N-type and P-type impurity layers different in impurity concentration in the depth direction of the semiconductor substrate 150 may be provided in the photodiode formation region.

The gate electrode 20 of the read transistor 2 is provided on the semiconductor substrate 150 via the gate insulating film 21. A sidewall insulating film 29 is provided on the side surface of the gate electrode 20.

In the semiconductor substrate 150, the semiconductor region between the two N-type impurity layers 10 and 60 serves as the channel of the read transistor 2.

The gate electrode 30 of the reset transistor 3 in the transistor formation region is provided on the semiconductor substrate 150 via a gate insulating film 31. The sidewall insulating film 29 is provided on the side surface of the gate electrode 30. In the semiconductor substrate 150, the semiconductor region between the two N-type impurity layers 60 and 35 serves as the channel of the reset transistor 3.

The amplifier transistor 5 and the address transistor 4 in the transistor formation region also have substantially the same sectional structure as the reset transistor 3.

The floating diffusion 6 is provided in the semiconductor substrate 150 to face the photodiode 1 across the read transistor 2. The photodiode 1 and the floating diffusion 6 are arranged in the channel length direction of the read transistor 2.

On the front side of the semiconductor substrate 150, a front surface shield layer 18 is provided in the N-type impurity layer 10 of the photodiode 1. The front surface shield layer 18 is, for example, a P-type impurity layer. The front surface shield layer 18 is formed in the surface layer of the N-type impurity semiconductor layer 10 at a distance from the channel region of the read transistor 2. The upper surface of the front surface shield layer 18 contacts the interlayer insulating films 92.

On the back side of the semiconductor substrate 150, a back surface shield layer 19 is provided in the semiconductor substrate 150. The back surface shield layer 19 is, for example, a P-type impurity layer.

The front/back surface shield layers 18 and 19 can inhibit a dark current generated in the photodiode 1.

In the present embodiment, the floating diffusion 6 is formed by the diffusion layer 60 and the semiconductor layer 61. In the floating diffusion formation region, the diffusion layer 60 is provided in the semiconductor substrate 150, and the semiconductor layer 61 is provided on the diffusion layer 60 on the front side of the semiconductor substrate.

On the front side of the semiconductor substrate, the semiconductor layer 61 as the elevated floating diffusion abuts on the diffusion layer 60. A contact plug CPx is provided on the semiconductor layer 61. An interconnect 80x is connected, via the contact plug CPx, to the diffusion layer 60 and the semiconductor layer 61 that form the floating diffusion 6.

The diffusion layer 60 as the floating diffusion is an N-type semiconductor region forming at least one of phosphorus (P) and arsenic (As), and has an impurity concentration of, for example, about $1 \times 10^{18}$ cm$^{-3}$. The diffusion layer 60 may have an impurity concentration of about $1 \times 10^{19}$ cm$^{-3}$ to $1 \times 10^{20}$ cm$^{-3}$.

The semiconductor layer 61 as the elevated floating diffusion contains an impurity. The semiconductor layer 61 includes one or more of phosphorus, germanium (Ge), and carbon (C) as the impurity. For example, the semiconductor layer 61 is formed by a silicon layer to which phosphorus is added, a silicon germanium (SiGe) layer, a silicon carbide (SiC) layer, or a silicon layer including germanium and carbon. The SiGe layer, the SiC layer, or the SiGeC layer may include phosphorus. The semiconductor layer may include boron (B) or As. The semiconductor layer 61 may be a silicon layer (e.g., polysilicon) including no impurity.

Thus, the semiconductor layer 61 is preferably made of an n-type/p-type silicon layer or mixed crystals including silicon as the main component.

The semiconductor layer 61 as the elevated floating diffusion is a high-concentration impurity semiconductor layer. The semiconductor layer 61 has an impurity concentration (e.g., the concentration of phosphorus) of, for example, $1 \times 10^{18}$ cm$^{-3}$ to $1 \times 10^{20}$ cm$^{-3}$.

For example, the impurity concentration in the semiconductor layer 61 changes in a direction perpendicular to the main surface of the semiconductor substrate. The impurity concentration on the bottom side (side that abuts on the semiconductor substrate) of the semiconductor layer 61 is lower than the impurity concentration on the top side (interlayer insulating film side) of the semiconductor layer 61. For example, the impurity concentration in the bottom of the semiconductor layer 61 in the vicinity of the interface between the semiconductor layer 61 and the diffusion layer 60 is about $1 \times 10^{18}$ cm$^{-3}$.

For example, when the SiGe layer (or the SiC layer, the SiGC layer) is used as the semiconductor layer 61, the concentration of germanium (or carbon, the total of germanium and carbon) on the bottom side of the semiconductor layer 61 is about 5 at % (atomic %), and the concentration of germanium on the top side of the semiconductor layer 61 is about 20 at %.

The semiconductor layer 61 is, for example, an epitaxial layer. When the semiconductor layer 61 is formed on the semiconductor substrate 150 by epitaxial growth, the semiconductor layer 61 has a sectional shape corresponding to the crystal structure of the material used for the semiconductor layer 61 and the crystal structure of the front surface of the semiconductor substrate 150 on which the semiconductor layer 61 is formed.

When the semiconductor layer 61 is an epitaxial layer which includes, as the main component, silicon formed on the semiconductor substrate 150 having a (100) face of Si on its front surface, the semiconductor layer 61 has, for example, a trapezoidal sectional shape. The side surface of the semiconductor layer 61 including silicon as the main component corresponds to a (111) face of Si (or SiGe) and a face equivalent thereto. The top surface of the semiconductor layer 61 including silicon as the main component corresponds to the (100) face of Si (or SiGe) and a face equivalent thereto. The side surface of the semiconductor layer 61 including silicon as the main component is tilted at an angle of about 55° degrees with the front surface of the semiconductor substrate.

The semiconductor layer 61 may be a polysilicon layer formed by a CVD method.

The semiconductor layer 61 as the elevated floating diffusion includes a gettering site to trap a metal impurity (e.g., Fe) in the semiconductor substrate 150. The gettering site in the semiconductor layer 61 is formed by an added dopant or by crystal defects resulting from lattice distortion caused by the addition of the impurity.

The semiconductor layer 61 in the floating diffusion formation region functions as the elevated floating diffusion, and also functions as the gettering site. The semiconductor layer 61 as the gettering layer 61 includes a metal impurity (metal ions, metal element) such as Fe as well as the added impurity.

Hereinafter, the semiconductor layer 61 may also be referred to as the gettering layer for the clarity of explanation.

For example, as in the shaded regions in FIG. 4, a semiconductor layer 65 of the same material as the elevated floating diffusion 61 is provided on the source/drain regions of the transistors 3, 4, and 5 in the transistor formation region.

As shown in FIG. 5, in the transistor formation region AA, the semiconductor layer 65 is provided on the source/drain diffusion layer 35 of the transistors 3, 4, and 5, and abuts on the source/drain diffusion layer 35. The semiconductor layer 65 functions as the source/drain of the transistors together with the diffusion layer 35. A contact plug CPz is provided on the semiconductor layer 65, and connects an interconnect 80z and the source/drain region of the transistor 3.

The semiconductor layer 65 in the transistor formation region AA functions as a gettering layer in the same manner as the semiconductor layer 61 in the floating diffusion formation region. Hereinafter, the semiconductor layers 65 on the source/drain diffusion layers 35 of the transistors 3, 4, and 5 may also be referred to as the gettering layers.

The gettering layers 61 and 65 are provided on the front surface of the semiconductor substrate 150 to be adjacent to the gate electrodes 20 and 30. The sidewall insulating film 29 is provided between the gettering layers 61 and 65 and the gate electrodes 20 and 30. The sidewall insulating film 29 is provided on the side surfaces of the gate electrodes 20 and 30 to prevent direct contact between the gettering layers 61 and 65 and the gate electrodes 20 and 30.

For example, the thickness of the gettering layers 61 and 65 is smaller than the thickness of the gate electrodes 20 and 30 of the transistors 2 and 3.

The space between the gettering layers 61 and 65 and the photodiode formation region can be adjusted by the dimensions of the gate electrode 20 of the read transistor 2 and the thickness of the sidewall insulating film 29.

A layer made of the same material as the semiconductor layers 61 and 65 may be provided on the source/drain diffusion layers 73 of the transistor 7 in the peripheral circuit region 125 in FIG. 2. This layer may be used as a gettering layer in the peripheral region 125.

In the vicinity of the interface between the semiconductor layers (gettering layers) 61 and 65 and the diffusion layers 60 and 35 in the floating diffusion formation region and the transistor formation region, a region (hereinafter referred to as a metal impurity region) 69 in which metal ions are segregated may be provided in the diffusion layers 60 and 35. For example, the metal impurity concentration of the diffusion layers 60 and 35 in the floating diffusion formation region and the transistor formation region is higher than the metal impurity concentration in the channel region of the transistors 2 and 3 and in the impurity layer 10 of the photodiode 1.

The diffusion layer 60 as the floating diffusion may include an impurity (e.g., Ge or C) derived from the semiconductor layer 61.

A defect attributed to the metal impurity in the impurity semiconductor layer 10 of the photodiode 1 behaves substantially in the same manner as a charge, and a defect caused by a recombination current resulting from metal contamination emerges as a white defect (white spot) in an image formed by the image sensor.

For example, in a manufacturing process of a general image sensor, the metal impurity in the semiconductor substrate is gettered by bulk micro defect (BMD) or polysilicon back seal (PBS).

As the BMD is formed in a region (region that abuts on the photodiode formation region) immediately under the photodiode formation region, the metal impurity may remain in the impurity semiconductor layer of the photodiode and in the regions located in its vicinity. Therefore, the BMD may lead to a risk of causing the white defect in the image sensor.

The PBS increases the heating temperature of the substrate for gettering to a relatively high temperature (600° C. or more) and applies the high temperature to the substrate for a relatively long period so that the metal impurity will reach the back surface of the semiconductor substrate. The heat treatment for gettering by the PBS generates a heat load in the semiconductor substrate, the impurity region in the semiconductor substrate, and the interconnect in the interlayer insulating film, and the characteristics of the image sensor may deteriorate.

When the floating diffusion including the diffusion layer is used as the gettering layer, the increase of the impurity concentration (e.g., $10^{20}$ cm$^{-3}$) of the diffusion layer for gettering may increase the depth of the junction between the diffusion layer and the semiconductor substrate and generate a leakage current.

In the image sensor according to the present embodiment, the semiconductor layer 61 as the elevated floating diffusion is used as the gettering layer.

In a later-described manufacturing method, the semiconductor layer 61 including a high-concentration impurity is formed on the front side of the semiconductor substrate 150 to abut on the diffusion layer 60, and then the semiconductor substrate 150 is subjected to the heat treatment for gettering.

As a result of the heat treatment, a metal impurity such as Fe in the semiconductor substrate 150 diffuses (moves) from the semiconductor substrate 150 into the semiconductor layer 61 as the gettering layer. A metal impurity such as iron (Fe) ions in the impurity layer 10 of the photodiode 1 is trapped in the semiconductor layer 61, and the concentration of the metal impurity in the impurity layer 10 of the photodiode 1 is reduced.

As in the present embodiment, the semiconductor layer 61 as the elevated floating diffusion and the gettering layer is provided in the region relatively close to the photodiode formation region, so that high-efficiency gettering can be performed by a heat treatment that does not generate an excessive heat load in the substrate, for example, a heat treatment within a relatively low temperature range (e.g., 300° C. to 600° C.).

The floating diffusion formation region in which the semiconductor layer 61 as the gettering layer is provided is not directly adjacent to the photodiode formation region. Therefore, the gettering layer located apart from the photodiode formation region can reduce that the metal impurity which has been drawn to the gettering layer 61 located apart from the photodiode formation region remains in the photodiode formation region (or its vicinity) after the gettering and can also inhibit the adverse effects of the remaining metal impurity, as compared with the case in which the semiconductor layer 61 is provided in the region directly adjacent to the photodiode formation region in a direction parallel to the front surface of the semiconductor substrate to abut on the semiconductor substrate 150 or provided in the region that vertically overlaps the photodiode formation region in a direction perpendicular to the front surface of the semiconductor substrate.

As described above, phosphorus having the function to trap the metal impurity is added to the semiconductor layer. Thus, the metal impurity is more easily segregated (separated) in the semiconductor layer 61, and the function of the semiconductor layer 61 as the gettering layer (gettering site) is improved.

When germanium or carbon is added to the silicon layer, lattice distortion (crystal defect) is generated in the layer as the gettering layer. The gettering site is further formed in the silicon layer by the lattice distortion, and the efficiency of the gettering is improved.

According to the image sensor in the present embodiment, a higher gettering efficiency can inhibit the increase of the heating temperature for gettering and inhibit the increase of the time for gettering. As a result, the heat load applied to the components of the image sensor can be reduced, and the deterioration of element characteristics caused by heat can be inhibited.

The use of the semiconductor layer as the elevated floating diffusion to a getting layer can reduce the impurity concentration of the diffusion layer 60 as the floating diffusion. This can inhibit the increase of the junction depth of the diffusion layer 60 and inhibit leakage current generation.

In the present embodiment, the layer of the same material as the semiconductor layer 61 serving as the elevated diffusion is formed on the source/drain diffusion layer 35 of the transistors 2, 3, 4, and 5. The semiconductor layer 65 functioning as the gettering layer is provided on the source/drain diffusion layer 35 of the transistors 2, 3, 4, and 5, and the metal impurity in the channel region of the transistors 2, 3, 4, and 5 is thereby trapped in the semiconductor layer 65. As a result, the characteristic deterioration of the transistor resulting from the defect in the channel region is inhibited.

As described above, in the present embodiment, the defect caused by the metal impurity (e.g., Fe ions) remaining in the impurity layer 10 of the photodiode 1 can be reduced by the relatively highly efficient gettering. As a result, the recombination current resulting from the metal impurity can be inhibited, and the generation of a white defect in an image formed by the image sensor can be inhibited.

Consequently, according to the image sensor in the present embodiment, the quality of the image formed by the image sensor can be improved.

The image sensor according to the embodiment has been described above as an example of the back side illumination type image sensor. However, the image sensor according to the embodiment may be an image sensor which brings light from the subject from the front side of the semiconductor substrate (hereinafter referred to as a front side illumination type image sensor). Although the CMOS image sensor has been illustrated above, the image sensor according to the embodiment may be a CCD image sensor. The advantageous effects described above can be provided even when the present embodiment is applied to the front side illumination type image sensor or the CCD image sensor.

(b) Manufacturing Method

A method of manufacturing the solid-state image sensing device (e.g., image sensor) according to the first embodiment is described with reference to FIG. 6 to FIG. 9.

FIG. 6 to FIG. 9 show the sectional process views of a pixel array 120 in the processes of the image sensor manufacturing method according to the present embodiment. Here, FIG. 2, FIG. 4, and FIG. 5 are also properly used in addition to FIG. 6 to FIG. 9 to describe the processes of the image sensor manufacturing method according to the present embodiment.

In the method of manufacturing the image sensor according to the present embodiment, the order of the formation of the components described later may be properly changed as long as process consistency is ensured.

As shown in FIG. 2, a mask (not shown) formed by photolithography and reactive ion etching (RIE) is used to form a device isolation region and a device isolation layer 91 in a predetermined region (e.g., peripheral circuit region) within a semiconductor substrate 150.

For example, as shown in FIG. 2, a device isolation trench having a shallow trench isolation (STI) structure is formed in the semiconductor substrate 150 in accordance with the mask. An insulator is embedded in the device isolation trench by the chemical vapor deposition (CVD) method or a coating method. As a result, the device isolation layer 91 having the STI structure is formed at a predetermined position in the semiconductor substrate 150.

Thus, the pixel array 120, the unit cell regions in the pixel array 120, and the peripheral circuit region 125 are marked out in the semiconductor substrate 150.

A mask different from the mask for forming the device isolation layer is used to form an N-type or P-type well region 159 in a predetermined region within the semiconductor substrate 150.

As shown in FIG. 5, components of unit cells (pixels) are formed in the unit cell regions of the pixel array 120. As shown in FIG. 2, components (e.g., transistors) of a peripheral circuit are formed in the well region 159 of the peripheral circuit region 125.

Gate insulating films 21 and 71 of transistors 2 and 7 are formed on the exposed surface (front surface) of the semiconductor substrate 150, for example, by a thermal oxidation treatment of the semiconductor substrate 150.

A polysilicon layer is deposited on the formed gate insulating films 21 and 71 by the CVD method. The polysilicon layer is then fabricated by photolithography and the RIE method, and gate electrodes 20 and 70 having a predetermined gate length and a predetermined gate width are formed on the surface (first surface) of the semiconductor substrate 150 across the gate insulating films 21 and 71.

Figure 6:
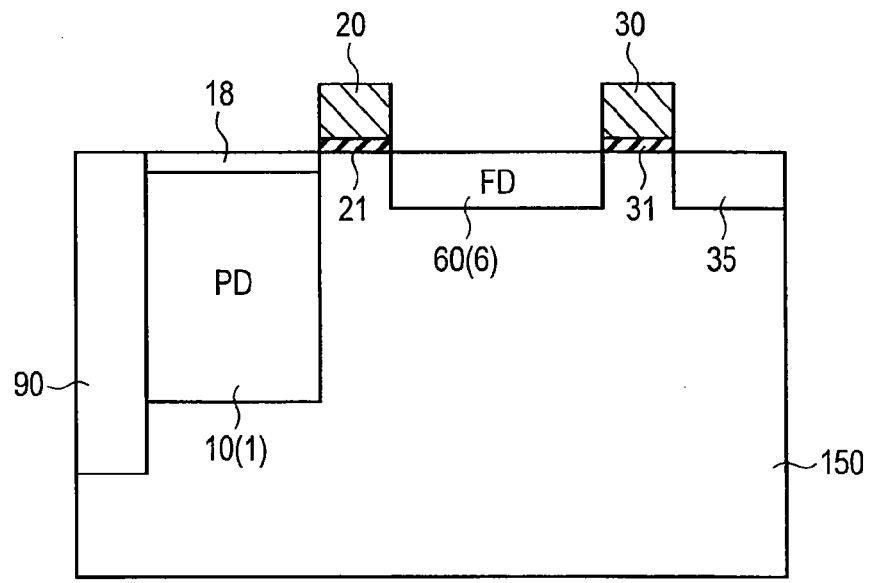
FIG. 6 is a sectional process view showing a process in a method of manufacturing the solid-state image sensing device according to the embodiment.

As shown in FIG. 2 and FIG. 6, in the pixel array 120, the formed gate electrode 22 and resist film (not shown) are used as masks, and the N-type impurity layer 10 of the photodiode 1 is formed in the photodiode formation region within the unit cell formation region by an ion implantation method.

In the floating diffusion formation region of the unit cell formation region, a diffusion layer 60 as a floating diffusion 6 is formed in the semiconductor substrate 150 by ion implantation so that the diffusion layer 60 includes phosphorus having an impurity concentration of about $10^{18}$ cm$^{-3}$. The diffusion layer 60 may be formed to include a high-concentration (e.g., $10^{20}$ cm$^{-3}$ or more) impurity.

A diffusion layer 35 as the source/drain of each transistor, for example, a reset transistor in the pixel array 120 is formed by ion implantation so that the diffusion layer 35 has a predetermined impurity concentration.

In the surface layer (exposed surface) of the N-type impurity semiconductor layer 10 of the photodiode 1, a P-type impurity layer 18 as the front surface shield layer 18 is formed in the N-type impurity semiconductor layer 10 by ion implantation.

For example, the peripheral circuit region 125 is covered by a resist film (not shown) in a period in which ion implantation for forming the photodiode 1 and the floating diffusion 6 are performed in the pixel array 120.

When the diffusion layer (impurity semiconductor layer) is formed by ion implantation, the crystallinity of the substrate may deteriorate. Therefore, annealing to recover the crystallinity of the substrate is preferably performed between the ion implantation and the formation of an epitaxial layer to allow for the formation of the epitaxial layer in the subsequent process.

In the region (N-type or P-type well region) 159 in which the transistor 7 is formed in the peripheral circuit region 125 shown in FIG. 2, a P-type or N-type impurity layer 73 as the source/drain of the transistor 7 is formed in the semiconductor substrate 150 by ion implantation that uses the gate electrode 70 as a mask. The process of forming the transistor 7 in the peripheral circuit region 125 and the process of forming the transistor in the pixel array 120 may be a common process.

As shown in FIG. 7, sidewall insulating films 29 are formed in a self-aligning manner on the side surfaces of the gate electrodes 20 and 30 of the read transistor 2 and the other transistors 3, 4, and 5.

After the sidewall insulating films 29 are formed on the side surfaces of the gate electrodes 20 and 30 of the transistors 2, 3, 4, and 5, a semiconductor layer 61 is formed, for example, by selective epitaxial growth on the diffusion layer 60 as the floating diffusion 6 on the front side of the semiconductor substrate 150. At the same time, a semiconductor layer 65 is formed on the source/drain diffusion layer 35 of the transistor.

The formed semiconductor layer 61 directly abuts on the diffusion layer 60. When the semiconductor layer 61 is formed by selective epitaxial growth, the crystal of the semiconductor layer 61 is oriented depending on the crystal face on the front surface of the semiconductor substrate, and the semiconductor layer 61 has a sectional shape corresponding to the crystal orientation.

The semiconductor layers 61 and 65 are formed by semiconductor layers including, for example, silicon as the main component. The semiconductor layer 61 formed in the floating diffusion formation region is used as an elevated floating diffusion and also used as a gettering layer. The semiconductor layer 65 provided in the transistor formation region is used as the source/drain and also used as a gettering layer.

For example, at least one impurity of germanium (Ge), phosphorus (P), and carbon (C) is added to the silicon layers 61 and 65 as the gettering layers. For example, a doping gas is introduced during the deposition of silicon (hereinafter referred to as in-situ doping), and an impurity such as Ge, P, and C is thereby added to the silicon layers 61 and 65. The function of the semiconductor layer as the gettering site is improved by the addition of the impurity to the silicon layers 61 and 65.

For example, an impurity (e.g., phosphorus) is added so that the concentration of the N-type (or P-type) dopant in the semiconductor layers 61 and 65 will be $1 \times 10^{18}$ cm$^{-3}$ to $1 \times 10^{20}$ cm$^{-3}$. In this case, the semiconductor layer 61 has a concentration profile that varies in a direction perpendicular to the front surface of the semiconductor substrate, and the impurity concentration on the bottom side (side that abuts on the diffusion layer 60) of the semiconductor layer 61 is lower than the impurity concentration on the top side of the semiconductor substrate. When the semiconductor layers 61 and 65 are silicon layers, the metal impurity is more easily segregated in the silicon layers 61 and 65 during gettering by the addition of the P-type or N-type dopant in the silicon layers.

Ge or C added to the silicon layers is lattice-substituted for the Si element in the silicon layers, and a mixed crystal layer of SiGe or SiC or SiGeC is formed. The concentration of Ge or C in the silicon layers is about 5 at % to 20 at %. Ge and C also have a concentration profile that varies in a direction perpendicular to the front surface of the semiconductor substrate, and the concentration on the bottom sides of the semiconductor layers 61 and 65 is lower than the concentration on the top side of the semiconductor layer. Lattice distortion (lattice defect) resulting from lattice mismatch between the semiconductor substrate and the epitaxial layers 61 and 65 is caused by the addition of at least one of Ge and C to the silicon layer. The function of the semiconductor layers 61 and 65 as the gettering sites is improved by the lattice defect.

Ge or C resulting from the semiconductor layer 61 may diffuse in the diffusion layer 60 within the floating diffusion formation region. The semiconductor layers 61 and 65 may be formed by the CVD method.

For example, an insulating film (not shown) is formed in advance on the impurity semiconductor layer 10 of the photodiode and the front surface shield layer 18 so that a semiconductor layer that directly abuts on the semiconductor substrate 150 may not be formed in the photodiode formation region during the formation of the semiconductor layers 61 and 65 as the gettering layers by the selective epitaxial growth. Alternatively, after the formation of a semiconductor layer, the semiconductor layer is selectively removed from the photodiode formation region.

As shown in FIG. 8, the semiconductor substrate 150 is subjected to, for example, a heat treatment of about 600° C. and the subsequent heat treatment in a temperature range of about 300° C. to 500° C. for gettering while the semiconductor layers 61 and 65 are provided on the front surface of the semiconductor substrate 150. The heat treatment for gettering may be conducted by the two-stage heat treatments different in the temperature range, or may be conducted by a heat treatment in which the temperature is slowly dropped from, for example, about 600° C. to about 300° C. (a heat treatment having a gentle temperature change gradient).

Thus, a metal impurity 200 in the semiconductor substrate 150 diffuses (moves) into the gettering layers 61 and 65 or into the diffusion layers 60 and 35 that abut on the gettering layers 61 and 65, and the metal impurity 200 is trapped in the gettering layers 61 and 65.

As a result, the metal impurity 200, for example, Fe moves to the floating diffusion formation region from the impurity semiconductor layer 10 in the photodiode formation region and its vicinity, and the concentration of the metal impurity in the impurity semiconductor layer 10 within the photodiode formation region decreases or substantially reaches zero. The concentration of the metal impurity in the floating diffusion formation region is higher than the concentration of the metal impurity in the photodiode formation region.

The metal impurity 200 in the channel region of the transistor is trapped in the gettering layer 65 on the source/drain diffusion layer 35.

When the gettering is conducted, a metal impurity region 69 may be formed in the vicinity of the interface between the semiconductor layers 61 and 65 as the gettering layers and the diffusion layer 60.

Thus, a metal impurity such as Fe is removed from the impurity semiconductor layer 10 within the photodiode formation region and its neighboring regions by the gettering treatment that uses the semiconductor layer 61 as the gettering layer (gettering site) formed in the floating diffusion formation region.

As shown in FIG. 9, after the metal impurity is removed from the photodiode formation region by the gettering, the gettering layers 61 and 65 are selectively etched. As a result, most of the gettering layers 61 and 65 are removed.

For example, as shown in FIG. 9, the thin gettering layers 61 and 65 may remain on the diffusion layers 60 and 35. For example, high impurity concentration regions in the gettering layers 61 and 65 are removed, low impurity concentration regions (e.g., region including an impurity of about $1 \times 10^{18}$ cm$^{-3}$) remain on the diffusion layers 60 and 35.

Thus, most of the gettering layers are removed after the gettering, so that it is possible to prevent the metal impurity trapped in the semiconductor layers 61 and 65 as the gettering layers from being re-diffused into the semiconductor substrate 150 by the heat treatment after the gettering in the manufacturing process of the image sensor 100.

As shown in FIG. 2 and FIG. 5, a multilayer interconnection structure including a plurality of interlayer insulating films 92 and a plurality of interconnects 80 is formed by the multilayer interconnection technique on the front surface of the semiconductor substrate 150 on which the gate electrode 20 of the transistor 2 is formed. The interlayer insulating films 92 cover the front surface of the semiconductor substrate 150, and cover, for example, the gate electrode 20 of the transistor 2.

In the formation process of the multilayer interconnection structure at each interconnect level, for example, the interlayer insulating film 92 which is a silicon oxide film is deposited by the CVD method. At each interconnect level, the interlayer insulating film 92 is planarized by a CMP method, and a contact plug CP1 and a via plug 81 are embedded in a contact hole formed in the interlayer insulating film 92 by photolithography and the RIE method.

A contact plug CPx is embedded in the interlayer insulating film 92 so that the contact plug CPx is connected to the semiconductor layer 61 remaining in the floating diffusion formation region. Thus, the semiconductor layer 61 used as the gettering layer 61 is reused as an elevated floating diffusion.

A contact plug CPz is also embedded in the interlayer insulating film 92 so that the contact plug CPz is connected to the semiconductor layer 65 remaining in the transistor formation region. Thus, the semiconductor layer 61 used as the gettering layer 61 is reused as the source/drain of the transistor.

For example, a conductive layer of aluminum is deposited on the interlayer insulating film 92 and on the plugs CP1, CPx, CPz, and 81 by a sputter method. The deposited conductive layer is fabricated into a predetermined shape by photolithography and the RIE method so that the conductive layer is connected to the plugs CP1, CPx, CPz, and 81. As a result, conductive layers 80, 80x, and 80z as interconnects are formed. The interconnects 80, 80x, and 80z made of copper or a copper alloy may be formed in a self-aligning manner by a damascene method in a trench (damascene trench) formed in the interlayer insulating film.

Thus, a plurality of elements 1, 2, and 7 of the semiconductor substrate 150 are connected by the interconnects of the multilayer interconnection technique, and each circuit of the image sensor is formed.

When a back side illumination type image sensor is formed, the uppermost interlayer insulating film 92 (and the conductive layer) on the front side of the semiconductor substrate 150 is planarized as shown in FIG. 2 and FIG. 5, and an adhesive layer (not shown) is then formed on the planarized surface of the uppermost interlayer insulating film 92. A support substrate 119 is then attached to the adhesive layer on the interlayer insulating film 92. Thus, the support substrate 119 is bonded to the interlayer insulating film 92 covering the front surface of the semiconductor substrate.

For example, before the support substrate 119 is attached to the interlayer insulating film 92, a redistribution layer may be formed by a redistribution technique on the uppermost interlayer insulating film 92 so that the redistribution layer is connected to the interconnect in the interlayer insulating film 92.

After the support substrate 119 is attached to the interlayer insulating film 92, the back surface of the semiconductor substrate 150 is selectively etched, for example, by the CMP method and by wet etching that uses an HF solution. As a result, the semiconductor substrate 150 is reduced in thickness.

As shown in FIG. 2 and FIG. 5, after the semiconductor substrate 150 is reduced in thickness, a P-type impurity semiconductor layer 19 as a back surface shield layer 19 is formed in the semiconductor substrate 150 within the pixel array 120 by ion implantation on the back surface of the semiconductor substrate 150.

After a protective film 97 is formed on the back surface of the semiconductor substrate, a color filter 117 is formed on the protective film 97 located at a position corresponding to the pixel array 120.

An insulating film (not shown) as a protective film is formed on the formed color filter 117. A microlens array 118 is formed on the protective film covering the color filter 117.

Before or after the formation of the color filter 117 and the microlens array 118, an interconnect, pad, or metal light blocking film on the back side of the semiconductor substrate 150 may be formed.

For example, after the formation of the color filter 117 and the microlens array 118, a through via 88A is embedded in a through-hole formed in the semiconductor substrate 150, as shown in FIG. 2. The through via 88A may be formed before the formation of the color filter 117 and the microlens array 118.

The image sensor according to the present embodiment is formed by the process described above.

On the front side of the semiconductor substrate in the floating diffusion formation region, the semiconductor layers 61 and 65 as the gettering layers are formed on the semiconductor substrate 150. The gettering layers 61 and 65 are formed to abut on the upper surface of the diffusion layer 60 as a floating diffusion FD.

As a result of gettering, the metal impurity (e.g., Fe) in the photodiode formation region is trapped in the gettering layers 61 and 65 by the action of high-concentration phosphorus added to the gettering layers 61 and 65 and by the action of the lattice defect resulting from Ge or C added to the gettering layers (layers including silicon as the main component).

As in the present embodiment, the gettering layer 61 is formed in the region relatively close to the photodiode formation region, so that the efficiency of the gettering is increased, and the concentration of the metal impurity in the impurity semiconductor layer 10 in the photodiode formation region and its vicinity is reduced. Moreover, according to the present embodiment, the gettering layer 61 is formed in the region that does not directly abut on the photodiode formation region. Therefore, it can be reduced that the metal impurity drawn to the gettering layer 61 remains in the photodiode formation region and its vicinity, and the adverse effects of the metal impurity on the characteristics of the photodiode can be inhibited.

Thus, in the image sensor manufacturing method according to the present embodiment, the gettering layers are formed in the vicinity of the photodiode formation region, so that the adverse effects of the remaining metal impurity can be inhibited, and the gettering can be relatively efficiently performed.

Consequently, according to the present embodiment, the increase of the heating temperature for gettering can be inhibited, and the increase of the time for gettering can be inhibited. As a result, according to the image sensor manufacturing method of the present embodiment, the heat load applied to the components of the image sensor can be reduced. Thus, according to the present embodiment, it is possible to inhibit the deterioration of the elements included in the image sensor caused by heat; for example, the deterioration of the interconnects/insulating films and unintended diffusion (dispersion) of the impurity (or dopant) caused by heat.

In the transistor formation region, the metal impurity in the channel region of the transistor is trapped in the gettering layer 65 formed in the source/drain region. As a result, the metal impurity in the channel region is reduced, and a transistor of improved characteristics is formed.

Known gettering techniques such as the BMD and the PBS may be used together with the gettering that uses the semiconductor layer provided in the floating diffusion formation region.

As described above, according to the solid-state image sensing device and the manufacturing method of the same in the first embodiment, it is possible to provide an image sensor that can improve the image quality.

(2) Modifications

Modifications of the solid-state image sensing device according to the embodiment are described with reference to FIG. 10 to FIG. 13.

In the modifications, the components which are substantially the same as those in the first embodiment are described when necessary. In FIG. 10 to FIG. 13, the interlayer insulating film and the color filter are simplified or not shown, as in the embodiment described above.

Example 1

The modification of the image sensor manufacturing method according to the embodiment is described with reference to FIG. 10.

FIG. 10 is a sectional process view illustrating the modification of the image sensor manufacturing method according to the embodiment.

In the image sensor manufacturing method according to the embodiment described with reference to FIG. 5 to FIG. 9, the gettering layers 61 and 65 to which an impurity is added are formed by enclosing a gas including P or Ge together with an Si formation gas during the deposition of the silicon layer (Si layer that includes at least one of P, Ge, and C) in the process of forming the semiconductor layers 61 and 65 as the gettering layers.

However, the impurity in the gettering layers 61 and 65 may be added by ion implantation to the gettering layers 61 and 65 deposited on the semiconductor substrate 150.

As shown in FIG. 10, a non-doped Si layer (or SiGe layer) 61Z is formed, for example, by the selective epitaxial growth on the semiconductor substrate 150 in the floating diffusion formation region and the transistor formation region.

The semiconductor substrate 150 is coated with a resist film. An opening is formed in the resist film by lithography and RIE so that the Si layer 61Z is exposed, and a mask layer 209 is formed.

Ion implantation is conducted while the mask layer 209 is formed on the semiconductor substrate 150. At least one of P, Ge, and C is added to the non-doped Si layer 61Z by ion implantation. As a result, a gettering layer 61Z including a gettering site is formed.

After the mask layer 209 is removed, gettering is performed as shown in FIG. 8, and the metal impurity in the semiconductor substrate 150 is trapped in the gettering layer 61Z.

The manufacturing processes described with reference to FIG. 9, FIG. 2, and FIG. 5 are then sequentially carried out, and the image sensor according to the present embodiment is formed.

Example 2

The modification of the image sensor and the manufacturing method of the same according to the embodiment are described with reference to FIG. 11.

FIG. 11 is a sectional process view illustrating the modification of the image sensor manufacturing method according to the embodiment.

As shown in FIG. 11, the gettering layer may be removed from the semiconductor substrate 150 after gettering.

When the gettering layer is removed, the contact plug CPx connected to the floating diffusion 6 directly contacts the diffusion layer 60 as the floating diffusion 6.

When the gettering layer is removed by etching, the front surface of the semiconductor substrate 150 may be overetched. In this case, the surface of the diffusion layer 60 as the floating diffusion on the front side of the semiconductor substrate 150 is set back to the back side of the semiconductor substrate 150 as compared with the surface of the impurity semiconductor layer 10 of the photodiode 1 and the front surface shield layer 18 on the front side of the semiconductor substrate 150.

For example, the metal impurity region in the diffusion layer 60 may be removed together with the gettering layer.

When the gettering layer is removed, the mask layer that selectively exposes the gettering layer is formed on the semiconductor substrate 150 after gettering substantially, for example, in the same manner as in FIG. 10.

In accordance with the mask layer formed on the semiconductor substrate 150, the gettering layer is selectively removed by etching (e.g., RIE).

Thus, the image sensor according to the present embodiment having the structure shown in FIG. 11 is formed.

As in the example shown in FIG. 11, the gettering layer (the metal impurity region) is completely removed after the gettering treatment, and it is thereby possible to prevent the metal impurity in the gettering layer from diffusing into the semiconductor substrate 150.

Example 3

The modification of the image sensor and the manufacturing method of the same according to the embodiment are described with reference to FIG. 12 and FIG. 13.

FIG. 12 is a sectional view illustrating the modification of the image sensor according to the embodiment.

As shown in FIG. 12, a silicide layer 67 may be provided on a gettering layer 61.

The silicide layer 67 on the gettering layer 61 is formed by the silicide treatment of the gettering layer 61. For example, when the gettering layer 61 is a layer including P, Ge, or B, the silicide layer 67 may including the impurity in the gettering layer 61 in addition to the silicon element and the metal element (e.g., nickel or cobalt) that includes silicide together with the silicon element.

For example, silicide layers 27 and 37 are provided on the gate electrodes 20 and 30 of the transistors 2 and 3.

The process of forming the silicide layer 67 on the gettering layer 61 is described with reference to FIG. 13. FIG. 13 is a sectional process view illustrating the modification of the image sensor manufacturing method according to the embodiment.

For example, the silicide treatment of the gettering layer is simultaneous with the silicide treatment of the gate electrodes and the source/drain diffusion layers of the transistors in the pixel array and in the peripheral circuit region.

After an insulating layer 201 is deposited on the semiconductor substrate 150, the insulating layer covering the region in which the silicide layer is formed is selectively removed by lithography and RIE. The gate electrodes 20 and 30 of the transistors 2 and 3 and the source/drain regions are exposed. On the other hand, the upper surface of the impurity semiconductor layer 10 of the photodiode 1 is covered by the insulating layer 201. At the same time, the insulating layer 201 covering the gettering layers 61 and 65 is removed, and the gettering layers 61 and 65 are exposed.

A metal film 202 for forming the silicide layer is formed on the gate electrodes 20 and 30, on the source/drain diffusion layer, on the gettering layers 61 and 65, and on the insulating layers 201 and 29.

After the metal film 202 is deposited, the semiconductor substrate 150 is subjected to a heat treatment. Silicon included in the gate electrodes 20 and 30, the source/drain diffusion layer 35, and the gettering layers 61 and 65 reacts (hereinafter referred to as a silicide reaction) with the elements that form the metal film 202.

Thus, as shown in FIG. 12, the silicide layers 27, 37, and 67 are formed in a self-aligning manner in a contact portion between the gate electrodes 20 and 30 and the metal film 202, a contact portion between the source/drain diffusion layer 35 and the metal film 202, and a contact portion between the gettering layers 61 and 65 and the metal film 202. The silicon layer covered by the insulating layers 201 and 29 does not directly contact the metal film 202, and is therefore not silicided.

After the silicide layers 27, 37, and 67 are formed, the metal film which has not reacted with silicon is selectively removed.

The interlayer insulating film, the contact plug, and the interconnect are then sequentially formed as described above, and the image sensor according to the embodiment is formed. The contact plugs CPx and CPz are connected to the silicide layer 67 on the gettering layers 61 and 65.

As long as the silicide layer is formed after gettering, the gettering layers 61 and 65 may be entirely silicided.

As the silicide layer 67 is provided on the gettering layer 61, the contact resistance between the contact plugs CPx and CPz and the layer 61 which functions as the floating diffusion can be reduced.

The silicide layer 67 (or the gettering layer made of silicide) is formed on the gettering layer 61 by substantially the same process as the process of forming the silicide layer on the gate electrode of the transistor and the source/drain diffusion layer. Therefore, the number of manufacturing processes of the image sensor is not increased by the process of forming the silicide layer 67 on the gettering layers 61 and 65.

Thus, according to the image sensor shown in FIG. 13, the electric characteristics of the image sensor can be improved without the increase in number of manufacturing processes of the image sensor.

As described above, the advantageous effects substantially similar to those according to the first embodiment can also be obtained in the modifications shown in FIG. 10 to FIG. 13.

(3) Application Example

An application example of the solid-state image sensing device according to each embodiment is described with reference to FIG. 14.

The solid-state image sensing device (image sensor) according to the embodiment is formed into a module, and applied to a digital camera or a camera-equipped mobile telephone.

FIG. 14 is a block diagram showing the application example of the image sensor according to the embodiment.

A camera (or camera-equipped mobile telephone) 900 including the image sensor 100 according to the present embodiment includes, in addition to the image sensor 100, for example, an optical lens unit 101, a signal processing unit (e.g., digital signal processor (DSP)) 102, a storage unit (memory) 103, a display unit (display) 104, and a control unit (controller) 105.

The image sensor 100 converts light from a subject into an electric signal.

The lens unit 101 collects the light from the subject to the image sensor 100, and forms a figure corresponding to the light from the subject into an image on the image sensor 100. The lens unit 101 includes a plurality of lenses and optical characteristics (for example, the focal length) of the lens unit 101 can mechanically or electrically be controlled by a combination of each lens.

The DSP 102 processes the signal output from the image sensor 100. The DSP 102 forms an image (image data) corresponding to a subject based on a signal from the image sensor 100.

Image data from the DSP 102 is stored in the memory 103. Externally supplied signals and data, and signals and data directly supplied from the image sensor 100 can also be stored in the memory 103. The memory 103 may be a memory chip such as a DRAM or flash memory loaded in the camera 900, or may be a memory card or a USB memory removable from the body of the camera 900.

The display 104 displays the image data from the DSP 102 or the memory 103. The data from the DSP 102 or the memory 103 is still image data or moving image data, and still images or moving images are displayed on the display 104.

The controller 105 controls the operations of the components 100 to 104 in the camera 900.

As described above, the image sensor 100 according to the present embodiment can be applied to the camera 900.

The camera 900 including the image sensor 100 according to the present embodiment can improve the quality of an image to be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image sensing device manufacturing method comprising:
   forming a photoelectric converting element, a diffusion layer included in a floating diffusion, and a read transistor, in a photoelectric converting element formation region of a semiconductor substrate, a floating diffusion formation region, and a read transistor formation region located between the photoelectric converting element formation region and the floating diffusion formation region, respectively; and
   forming a first semiconductor layer including a first impurity on the diffusion layer on a first surface of the semiconductor substrate; and
   conducting a heat treatment after the first semiconductor layer is formed,
   wherein after the heat treatment, the concentration of a metal impurity in the floating diffusion formation region is higher than the concentration of a metal impurity in the photoelectric converting element formation region.

2. The solid-state image sensing device manufacturing method according to claim 1, wherein
   a metal impurity in the semiconductor substrate is moved into the first semiconductor layer by the heat treatment.

3. The solid-state image sensing device manufacturing method according to claim 1, wherein
   the concentration of a metal impurity in the first semiconductor layer is higher than the concentration of a metal impurity in the diffusion layer.

4. The solid-state image sensing device manufacturing method according to claim 1, further comprising:
   removing the first semiconductor layer after the heat treatment.

5. The solid-state image sensing device manufacturing method according to claim 4, further comprising:
   removing an impurity region including a metal impurity in a boundary between the diffusion layer and the first semiconductor layer, and setting back the upper surface of the diffusion layer to a second surface opposite to the first surface of the semiconductor substrate, during the removal of the first semiconductor layer.

6. The solid-state image sensing device manufacturing method according to claim 1, further comprising:
   forming a silicide layer on a gate electrode of the read transistor and on the first semiconductor layer; and
   forming, via the silicide layer, a contact portion to be connected to the first semiconductor layer and the floating diffusion including the diffusion layer, respectively.

7. The solid-state image sensing device manufacturing method according to claim 1, further comprising:
   forming a first transistor in a first region adjacent to the floating diffusion formation region simultaneously with the formation of the read transistor; and
   forming a second semiconductor layer including the same material as the first semiconductor layer on a source/drain diffusion layer of the first transistor simultaneously with the formation of the first semiconductor layer.

8. The solid-state image sensing device manufacturing method according to claim 1, further comprising:
   forming an interlayer insulating film on the first surface of the semiconductor substrate after the first semiconductor layer is formed.

9. The solid-state image sensing device manufacturing method according to claim 1, wherein
   the first semiconductor layer includes a gettering site generated by the first impurity.

10. The solid-state image sensing device manufacturing method according to claim 1, wherein
    the first semiconductor layer is formed by a silicon layer including at least one of phosphorus, germanium, and carbon as the first impurity.

11. The solid-state image sensing device manufacturing method according to claim 1, wherein
    the first semiconductor layer is formed by epitaxial growth, and a crystal defect as a gettering site is formed in the first semiconductor layer.

* * * * *